US009304396B2

(12) United States Patent
Shamma et al.

(10) Patent No.: US 9,304,396 B2
(45) Date of Patent: Apr. 5, 2016

(54) PECVD FILMS FOR EUV LITHOGRAPHY

(71) Applicant: Lam Research Corporation, Fremont, CA (US)

(72) Inventors: Nader Shamma, Cupertino, CA (US); Thomas Mountsier, San Jose, CA (US); Don Schlosser, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 39 days.

(21) Appl. No.: 14/185,757

(22) Filed: Feb. 20, 2014

(65) Prior Publication Data

US 2014/0239462 A1 Aug. 28, 2014

Related U.S. Application Data

(60) Provisional application No. 61/769,126, filed on Feb. 25, 2013.

(51) Int. Cl.

*H01L 21/033* (2006.01)
*G03F 7/09* (2006.01)
*H01L 21/314* (2006.01)
*G03F 7/16* (2006.01)
*H01L 21/311* (2006.01)
*H01L 21/027* (2006.01)

(52) U.S. Cl.

CPC *G03F 7/092* (2013.01); *G03F 7/16* (2013.01); *H01L 21/0276* (2013.01); *H01L 21/0332* (2013.01); *H01L 21/3146* (2013.01); *H01L 21/31144* (2013.01)

(58) Field of Classification Search

CPC .................... H01L 21/0337; H01L 21/31144; H01L 21/0338
USPC ................................. 438/736, 763; 29/25.01
See application file for complete search history.

(56) References Cited

U.S. PATENT DOCUMENTS 3,816,976 A 6/1974 Stork et al.
4,209,357 A 6/1980 Gorin et al.

(Continued)

FOREIGN PATENT DOCUMENTS

| | | |
|---|---|---|
| FR | 2853313 | 10/2004 |
| JP | 62019539 | 1/1987 |
| JP | 08-152262 | 6/1996 |
| SU | 382671 | 10/1973 |
| WO | WO 2005/048367 | 5/2005 |

OTHER PUBLICATIONS

U.S. Appl. No. 13/160,399, filed Jun. 14, 2011, entitled "Methods of Depositing Highly Selective Transparent Ashable Hardmask Films".
U.S. Appl. No. 11/612,382, filed Dec. 18, 2006, entitled "Methods of Improving Ashable Hardmask Adhesion to Metal layers".

(Continued)

*Primary Examiner* — George Fourson, III
(74) *Attorney, Agent, or Firm* — Weaver Austin Villeneuve & Sampson LLP

(57) ABSTRACT

Provided herein are multi-layer stacks for use in extreme ultraviolet lithography tailored to achieve optimum etch contrast to shrink features and smooth the edges of features while enabling use of an optical leveling sensor with little or reduced error. The multi-layer stacks may include an atomically smooth layer with an average local roughness of less than a monolayer, and one or more underlayers, which may be between a target layer to be patterned and a photoresist. Also provided are methods of depositing multi-layer stacks for use in extreme ultraviolet lithography.

14 Claims, 7 Drawing Sheets

300

Deposit one or more underlayers with high etch contrast
303

Deposit atomically smooth layer
305

Deposit photoresist
307

(56) References Cited

U.S. PATENT DOCUMENTS 4,274,841 A 6/1981 Andresen et al.
4,668,261 A 5/1987 Chatzipetros et al.
4,673,589 A 6/1987 Standley
4,863,493 A 9/1989 Kotani et al.
4,863,760 A 9/1989 Schantz et al.
4,975,144 A 12/1990 Yamazaki et al.
5,222,549 A 6/1993 Ishii et al.
5,231,057 A 7/1993 Doki et al.
5,261,250 A 11/1993 Missimer
5,378,316 A 1/1995 Franke et al.
5,470,661 A 11/1995 Bailey et al.
5,562,952 A 10/1996 Nakahigashi et al.
5,670,066 A 9/1997 Barnes et al.
5,792,269 A 8/1998 Deacon et al.
5,900,288 A 5/1999 Kuhman et al.
5,968,379 A 10/1999 Zhao et al.
5,985,103 A 11/1999 Givens et al.
6,006,797 A 12/1999 Bulow et al.
6,030,591 A 2/2000 Tom et al.
6,035,803 A 3/2000 Robles et al.
6,041,734 A 3/2000 Raoux et al.
6,066,209 A 5/2000 Sajoto et al.
6,150,719 A 11/2000 Saia et al.
6,241,793 B1 6/2001 Lee et al.
6,286,321 B1 9/2001 Glater
6,319,299 B1 11/2001 Shih et al.
6,331,480 B1 12/2001 Tsai et al.
6,367,413 B1 4/2002 Sill et al.
6,387,819 B1 5/2002 Yu
6,422,918 B1 * 7/2002 Avanzino et al. ................. 451/8
6,458,516 B1 10/2002 Ye et al.
6,465,051 B1 10/2002 Sahin et al.
6,478,924 B1 11/2002 Shamouilian et al.
6,541,397 B1 4/2003 Bencher
6,573,030 B1 6/2003 Fairbairn et al.
6,613,434 B1 9/2003 Drevillon et al.
6,617,553 B2 9/2003 Ho et al.
6,635,185 B2 10/2003 Demmin
6,777,349 B2 8/2004 Fu et al.
6,787,452 B2 9/2004 Sudijono et al.
6,787,819 B2 9/2004 Rhodes et al.
6,967,072 B2 11/2005 Latchford et al.
7,064,078 B2 6/2006 Liu et al.
7,202,176 B1 4/2007 Goto et al.
7,205,228 B2 4/2007 Padhi et al.
7,220,982 B2 5/2007 Campbell
7,223,526 B2 5/2007 Fairbairn et al.
7,235,478 B2 6/2007 Geng et al.
7,271,106 B2 * 9/2007 Abatchev et al. ............. 438/717
7,288,484 B1 10/2007 Goto et al.
7,314,506 B2 1/2008 Vininski et al.
7,323,401 B2 1/2008 Ramaswamy et al.
7,381,644 B1 6/2008 Subramonium et al.
7,399,712 B1 7/2008 Graff
7,495,984 B2 2/2009 Kim et al.
7,576,009 B2 8/2009 Lee et al.
7,803,715 B1 9/2010 Haimson et al.
7,820,556 B2 10/2010 Hsu et al.
7,915,166 B1 3/2011 Yu et al.
7,955,990 B2 6/2011 Henri et al.
7,981,777 B1 7/2011 Subramonium et al.
7,981,810 B1 7/2011 Subramonium et al.
8,110,493 B1 2/2012 Subramonium et al.
8,114,782 B2 2/2012 Graff
8,129,281 B1 3/2012 Cheung et al.
8,227,352 B2 7/2012 Yu et al.
8,309,473 B2 11/2012 Hsu et al.
8,435,608 B1 5/2013 Subramonium et al.
8,563,414 B1 10/2013 Fox et al.
8,569,179 B2 10/2013 Graff
8,664,124 B2 3/2014 Graff
8,669,181 B1 3/2014 Yu et al.
8,962,101 B2 2/2015 Subramonium et al.
2001/0021491 A1 9/2001 Chen et al.
2002/0182848 A1 12/2002 Joseph et al.
2003/0044532 A1 3/2003 Lee et al.
2003/0106647 A1 6/2003 Koshiishi et al.
2004/0000534 A1 1/2004 Lipinski
2004/0016972 A1 1/2004 Singh et al.
2004/0018750 A1 1/2004 Sophie et al.
2004/0023502 A1 2/2004 Tzou et al.
2004/0140506 A1 7/2004 Singh et al.
2004/0180551 A1 9/2004 Biles et al.
2004/0224504 A1 11/2004 Gadgil
2004/0266195 A1 12/2004 Dokumaci et al.
2005/0042889 A1 2/2005 Lee et al.
2005/0054202 A1 3/2005 Pan et al.
2005/0098119 A1 5/2005 Burger et al.
2005/0112506 A1 5/2005 Czech et al.
2005/0129935 A1 6/2005 Kunitake et al.
2005/0130404 A1 6/2005 Moghadam et al.
2005/0167394 A1 8/2005 Liu et al.
2005/0202683 A1 9/2005 Wang et al.
2005/0260411 A1 11/2005 Ravi
2005/0287771 A1 12/2005 Seamons et al.
2006/0019486 A1 1/2006 Yu et al.
2006/0091559 A1 5/2006 Nguyen et al.
2006/0154086 A1 7/2006 Fuller et al.
2006/0154477 A1 7/2006 Geng et al.
2006/0197881 A1 9/2006 Kang et al.
2006/0205223 A1 9/2006 Smayling
2006/0231524 A1 10/2006 Liu et al.
2006/0246373 A1 * 11/2006 Wang ......................... 430/270.1
2007/0032054 A1 2/2007 Ramaswamy et al.
2007/0048674 A1 3/2007 Wells
2007/0054500 A1 3/2007 Bencher
2007/0059913 A1 3/2007 King et al.
2007/0072112 A1 * 3/2007 Prokopowicz et al. .... 430/270.1
2007/0077780 A1 4/2007 Wang et al.
2007/0105303 A1 5/2007 Busch et al.
2007/0125762 A1 6/2007 Cui et al.
2007/0128538 A1 6/2007 Fairbairn et al.
2007/0140029 A1 6/2007 Kim et al.
2007/0166546 A1 7/2007 Ichikawa et al.
2007/0166979 A1 7/2007 Wang et al.
2007/0202640 A1 8/2007 Al-Bayati et al.
2007/0247073 A1 10/2007 Paterson et al.
2008/0073636 A1 3/2008 Kim
2008/0083916 A1 4/2008 Kim
2008/0128907 A1 6/2008 Yang et al.
2008/0200003 A1 8/2008 Hong et al.
2008/0242912 A1 10/2008 Letessier et al.
2008/0254639 A1 10/2008 Graff
2008/0254641 A1 10/2008 Kobayashi et al.
2008/0264803 A1 10/2008 Agrawal
2009/0176174 A1 * 7/2009 Chen et al. ................. 430/281.1
2009/0182180 A1 7/2009 Huang et al.
2009/0305516 A1 12/2009 Hsu et al.
2010/0151691 A1 6/2010 Henri et al.
2010/0297853 A1 11/2010 Hsu et al.
2011/0236594 A1 9/2011 Haverkamp et al.
2011/0236600 A1 9/2011 Fox et al.
2011/0244142 A1 10/2011 Cheng et al.
2012/0149207 A1 6/2012 Graff
2012/0196446 A1 8/2012 Graff
2013/0216956 A1 * 8/2013 Kishioka et al. .............. 430/324
2014/0057454 A1 2/2014 Subramonium et al.
2014/0199628 A1 * 7/2014 Edelstein et al. .......... 430/270.1
2014/0273469 A1 * 9/2014 Wahl et al. .................... 438/702
2014/0273473 A1 * 9/2014 Schmid et al. ................ 438/703
2015/0093908 A1 4/2015 Reddy et al.
2015/0093915 A1 4/2015 Reddy et al.

OTHER PUBLICATIONS

U.S. Appl. No. 11/849,208, filed Aug. 31, 2007, entitled "Methods and Apparatus for Plasma-Based Deposition".

U.S. Appl. No. 13/856,364, filed Apr. 3, 2013, entitled "Methods of Depositing Smooth and Conformal Ashable Hard Mask Films".

US Office Action, dated May 15, 2015, issued in U.S. Appl. No. 14/270,001.

US Final Office Action, dated Oct. 9, 2015, issued in U.S. Appl. No. 14/270,001.

(56) References Cited

OTHER PUBLICATIONS

US Notice of Allowance, dated Oct. 4, 2006, issued in U.S. Appl. No. 11/318,269.
US Office Action, dated Dec. 14, 2006, issued in U.S. Appl. No. 11/318,269.
US Notice of Allowance, dated May 7, 2007, issued in U.S. Appl. No. 11/318,269.
US Office Action, dated Aug. 27, 2007, issued in U.S. Appl. No. 11/318,269.
US Notice of Allowance, dated Jan. 7, 2008, issued in U.S. Appl. No. 11/318,269.
US Office Action, dated Nov. 22, 2010, issued in U.S. Appl. No. 12/048,967.
US Office Action, dated Apr. 18, 2011, issued in U.S. Appl. No. 12/048,967.
US Notice of Allowance, dated Oct. 7, 2011, issued in U.S. Appl. No. 12/048,967.
US Office Action dated, Dec. 27, 2007, issued in U.S. Appl. No. 11/449,983.
US Final Office Action, dated Jul. 9, 2008, issued in U.S. Appl. No. 11/449,983.
US Office Action, dated Jan. 5, 2009, issued in U.S. Appl. No. 11/449,983.
US Final Office Action, dated Sep. 15, 2009, issued in U.S. Appl. No. 11/449,983.
US Office Action, dated Jun. 21, 2010, issued in U.S. Appl. No. 11/449,983.
US Final Office Action, dated Dec. 30, 2010, issued in U.S. Appl. No. 11/449,983.
US Notice of Allowance, dated Mar. 16, 2011, issued in U.S. Appl. No. 11/449,983.
US Office Action, dated Jun. 1, 2007, issued in U.S. Appl. No. 11/612,382.
US Office Action, dated Oct. 9, 2007, issued in U.S. Appl. No. 11/612,382.
US Final Office Action, dated May 13, 2008, issued in U.S. Appl. No. 11/612,382.
US Office Action, dated Aug. 19, 2008, issued in U.S. Appl. No. 11/612,382.
US Final Office Action, dated Feb. 24, 2009, issued in U.S. Appl. No. 11/612,382.
US Final Office Action, dated May 12, 2009, issued in U.S. Appl. No. 11/612,382.
US Final Office Action, dated Dec. 9, 2009, issued in U.S. Appl. No. 11/612,382.
US Office Action, dated Mar. 26, 2010, issued in U.S. Appl. No. 11/612,382.
US Office Action dated Nov. 20, 2009, issued in U.S. Appl. No. 11/710,652.
US Final Office Action dated Apr. 15, 2010, issued in U.S. Appl. No. 11/710,652.
US Office Action dated Aug. 5, 2010, issued in U.S. Appl. No. 11/710,652.
US Notice of Allowance dated Nov. 24, 2010, issued in U.S. Appl. No. 11/710,652.
US Office Action dated Jul. 9, 2013, issued in U.S. Appl. No. 13/032,392.
US Notice of Allowance dated Oct. 25, 2013, issued in U.S. Appl. No. 13/032,392.
US Office Action, dated Jan. 5, 2009, issued in U.S. Appl. No. 11/710,377.
US Office Action, dated Aug. 19, 2009, issued in U.S. Appl. No. 11/710,377.
US Office Action, dated Mar. 31, 2010, issued in U.S. Appl. No. 11/710,377.
US Notice of Allowance, dated Mar. 22, 2011, issued in U.S. Appl. No. 11/710,377.
US Office Action, dated Sep. 3, 2010, issued in U.S. Appl. No. 11/849,208.
US Final Office Action, dated Apr. 12, 2011, issued in U.S. Appl. No. 11/849,208.
US Final Office Action, dated Sep. 14, 2012, issued in U.S. Appl. No. 11/849,208.
US Final Office Action, dated Apr. 24, 2013, issued in U.S. Appl. No. 11/849,208.
US Office Action, dated Feb. 28, 2014, issued in U.S. Appl. No. 13/974,808.
US Final Office Action, dated Aug. 4, 2014, issued in U.S. Appl. No. 13/974,808.
US Notice of Allowance, dated Oct. 23, 2014, issued in U.S. Appl. No. 13/974,808.
US Office Action, dated Oct. 19, 2011, issued in U.S. Appl. No. 12/163,670.
US Office Action, dated Feb. 14, 2012, issued in U.S. Appl. No. 12/163,670.
US Office Action, dated Jul. 6, 2012, issued in U.S. Appl. No. 12/163,670.
US Final Office Action dated Oct. 18, 2012, issued in U.S. Appl. No. 12/163,670.
US Notice of Allowance dated Jan. 3, 2013, issued in U.S. Appl. No. 12/163,670.
US Notice of Allowance dated Sep. 22, 2015, issued in U.S. Appl. No. 13/856,364.
US Notice of Allowance, dated Nov. 2, 2010, issued in U.S. Appl. No. 12/334,220.
US Supplemental Notice of Allowance, dated Feb. 8, 2011, issued in U.S. Appl. No. 12/334,220.
US Office Action, dated Aug. 19, 2009, issued in U.S. Appl. No. 12/133,223.
US Final Office Action, dated Dec. 21, 2009, issued in U.S. Appl. No. 12/133,223.
US Notice of Allowance, dated Mar. 2, 2010, issued in U.S. Appl. No. 12/133,223.
US Office Action, dated Nov. 9, 2011, issued in U.S. Appl. No. 12/786,842.
US Final Office Action, dated Apr. 19, 2012, issued in U.S. Appl. No. 12/786,842.
US Notice of Allowance, dated Jul. 20, 2012, issued in U.S. Appl. No. 12/786,842.
US Office Action, dated Aug. 10, 2012, issued in U.S. Appl. No. 12/766,721.
US Final Office Action, dated Mar. 14, 2013, issued in U.S. Appl. No. 12/766,721.
US Notice of Allowance, dated Jun. 28, 2013, issued in U.S. Appl. No. 12/766,721.
US Office Action, dated Jun. 1, 2007, issued in U.S. Appl. No. 11/263,148.
US Final Office Action, dated Oct. 24, 2007, issued in U.S. Appl. No. 11/263,148.
US Notice of Allowance, dated Mar. 18, 2008, issued in U.S. Appl. No. 11/263,148.
US Office Action, dated May 2, 2011, issued in U.S. Appl. No. 11/263,148.
US Notice of Allowance, dated Oct. 13, 2011, issued in U.S. Appl. No. 11/263,148.
US Office Action, dated Feb. 15, 2013, issued in U.S. Appl. No. 13/371,184.
US Notice of Allowance, dated Jul. 1, 2013, issued in U.S. Appl. No. 13/371,184.
US Office Action, dated Oct. 9, 2013, issued in U.S. Appl. No. 13/372,363.
US Notice of Allowance, dated Dec. 30, 2013, issued in U.S. Appl. No. 13/372,363.
Korean Office Action, dated Sep. 15, 2015, issued in KR Application No. 10-2009-0123999.
Taiwan Office Action, dated May 8, 2014, issued in TW Application No. 098142631.
Korean Office Action, dated Jun. 1, 2010, issued in KR Application No. 2009/0048358.
Callegari et al. (1993) "Optical properties of hydrogenated amorphous-carbon film for attenuated phase-shift mask applications," *J.Vac. Sci. Technol. B* 11(6):2697-2699.

(56) References Cited

OTHER PUBLICATIONS

Fabtech news release: "New Product: Ashable hard mask process from Novellus targets high aspect ratio etch," (Jun. 28, 2007), 2 pages.
Grill, A. (1999) "Diamond-like carbon: state of the art," *Diamond and Related Materials 8*, pp. 428-434.
Grill, A. (1999) "Plasma-deposited diamondlike carbon and related materials," IBM Journal of Research and Development, vol. 43, ½, http://research.ibm.com/journal/rd/431/grill.html.,14 pp.
Grill, et al. (1990) "Diamondlike carbon films by RF plasma-assisted chemical vapor deposition from acetylene," *IBM J. Res. Develop.*, 34(6):849-857.
Holmes et al. (1987) "Trimethylsilylacetylene", *Organic Syntheses, Coll*. vol. 8, p. 606; vol. 65, p. 61.
Ikeda et al. (1992) "Top-PECVD": A New Conformal Plasma Enhanced CVD Technology using TEOS, Ozone and Pulse-modulated RF Plasma, *IEEE*, pp. 11.2.1-11.2.4.
Jacobsohn et al. (1998) "Hydrogenated Carbon-Nitrogen Films Obtained by PECVD Using Acetylyne and Nitrogen As Precursor Gases," Mat. Res. Soc. Symp. Proc., 498: 283-288.
Kragler et al. (1995) "Scanning tunneling microscopy based lithography employing amorphous hydrogenated carbon as a high resolution resist mask," *Appl. Phys. Lett*. 67(8):1163-1165.
Kreupl, Franz et al. (2008) "Carbon-Based Resistive Memory," presented at *IEDM*, submitted Jun. 26, 2008; accepted Aug. 4, 2008, 4 pages.
Lemaire, P.J., Walker, K.L., Kranz, K.S., Huff, R.G. and DiMarcello, F.V. "Diffusion of Hydrogen Through Hermetic Carbon Films on Silica Fibers," AT&T Bell Laboratories, 600 Mountain Avenue, Murray Hill, NJ 07974. *Mat. Res. Soc. Symp. Proc.*, 172:85-96 © 1990 Materials Research Society.
Matheson brochure: "PICO-TRAP™ AHM: Ultra-Purification System for PECVD of Amorphous Carbon Films," (Apr. 2010), *Matheson*, 2pp.
Muhl et al. (1999) "A Review of the Preparation of Carbon Nitride Films," Diamond and Related Materials, 8:1809-1830.
Ong, Soon-Eng et al. (2007) "Temperature effect on bonding structures of amorphous carbon containing more than 30at.% silicon," *Diamond & Related Materials*, 16:1823-1827.
Subramonium et al., "Low Temperature Ashable Hardmask (AHM™) Films for sub-45nm Patterning," citation information unavailable, no date available, 3pp.
van de Ven et al. (1990) "Advantages of Dual Frequency PECVD for Deposition of ILD and Passivation Films," VLSI Multilevel Interconnection Conference Proceedings, Seventh International IEEE, 194-201.
Voronkin et al. (1994) "Structure and mechanical properties of a-C:H films deposited onto polymer substrates: Diamond and Related Materials," 4:5-9.

* cited by examiner

PECVD FILMS FOR EUV LITHOGRAPHY

CROSS-REFERENCE TO RELATED APPLICATION

This application claims benefit of U.S. Provisional Patent Application No. 61/769,126, filed Feb. 25, 2013, and titled "PECVD FILMS FOR EUV LITHOGRAPHY," which is incorporated by reference herein in its entirety and for all purposes.

BACKGROUND

Patterning methods are critical to semiconductor processing. In particular, extreme ultraviolet (EUV) lithography has been explored to extend lithographic technology beyond its optical limits and replace current photolithography methods to pattern small critical dimension features. Current EUV lithography methods result in poor edge roughness and weak patterns that may ultimately render the substrate useless.

SUMMARY

Provided herein is a multi-layer stack suitable for extreme ultraviolet lithography and methods for depositing a multi-layer stack in semiconductor processing. One aspect involves a multi-layer stack on a semiconductor substrate for extreme ultraviolet lithography including an atomically smooth layer with an average local roughness of less than a monolayer, and one or more underlayers, such that the one or more underlayers have high etch contrast to layers adjacent to them.

In various embodiments, the multi-layer stack also includes a photoresist, and a target layer, such that the atomically smooth layer and the one or more underlayers are between the photoresist and the target layer, and the atomically smooth layer is adjacent to the photoresist. In some embodiments, the photoresist is between about 100 Å and 600 Å thick. In some embodiments, the thickness of the atomically smooth layer is between about 30 Å and about 60 Å.

In many embodiments, one of the one or more underlayers is a hardmask adjacent to a target layer. In some embodiments, the hardmask includes amorphous carbon having a hydrogen content less than about 20%. In some embodiments, the underlayer of amorphous carbon is between about 400 Å and about 900 Å. In some embodiments, the underlayer of amorphous carbon has a modulus to stress ratio of about 1:1. In various embodiments, one of the one or more underlayers includes amorphous silicon having a hydrogen content less than about 5%.

In various embodiments, the atomically smooth layer includes an oxide. In some embodiments, at least one of the one or more underlayers reflects or absorbs a leveling beam struck on the substrate to measure wafer leveling. In some embodiments, the average local roughness of the atomically smooth layer is less than about 2 Å.

Another aspect involves a method of processing a semiconductor substrate for extreme ultraviolet lithography by depositing one or more underlayers on a target layer; depositing an atomically smooth layer having a roughness of less than a monolayer; and depositing a photoresist layer on top of the atomically smooth layer.

In various embodiments, each layer is deposited by plasma-enhanced chemical vapor deposition. In many embodiments, depositing the one or more underlayers further includes depositing an amorphous carbon layer on the target layer by exposing the substrate to a hydrocarbon precursor.

In some embodiments, the atomically smooth layer is deposited to a thickness between about 30 Å and about 60 Å. In various embodiments, the method also includes patterning the photoresist layer using extreme ultraviolet lithography.

Another aspect involves an apparatus for processing semiconductor substrates including one or more process chambers; one or more gas inlets into the one or more process chambers and associated flow-control hardware; a low frequency radio frequency (LFRF) generator; a high frequency radio frequency (HFRF) generator; and a controller having at least one processor and a memory. The at least one processor and the memory are communicatively connected with one another, the at least one processor is at least operatively connected with the flow-control hardware, the LFRF generator, and the HFRF generator, and the memory stores computer-executable instructions for: depositing one or more underlayers on a substrate; depositing an atomically smooth layer having a roughness of less than a monolayer; and depositing a photoresist layer on top of the atomically smooth layer.

In various embodiments, the atomically smooth underlayer is deposited to a thickness between about 30 Å and about 60 Å. In some embodiments, at least one of the one or more underlayers deposited on the substrate includes amorphous carbon.

These and other aspects are described further below with reference to the drawings.

DETAILED DESCRIPTION

Figure 1:
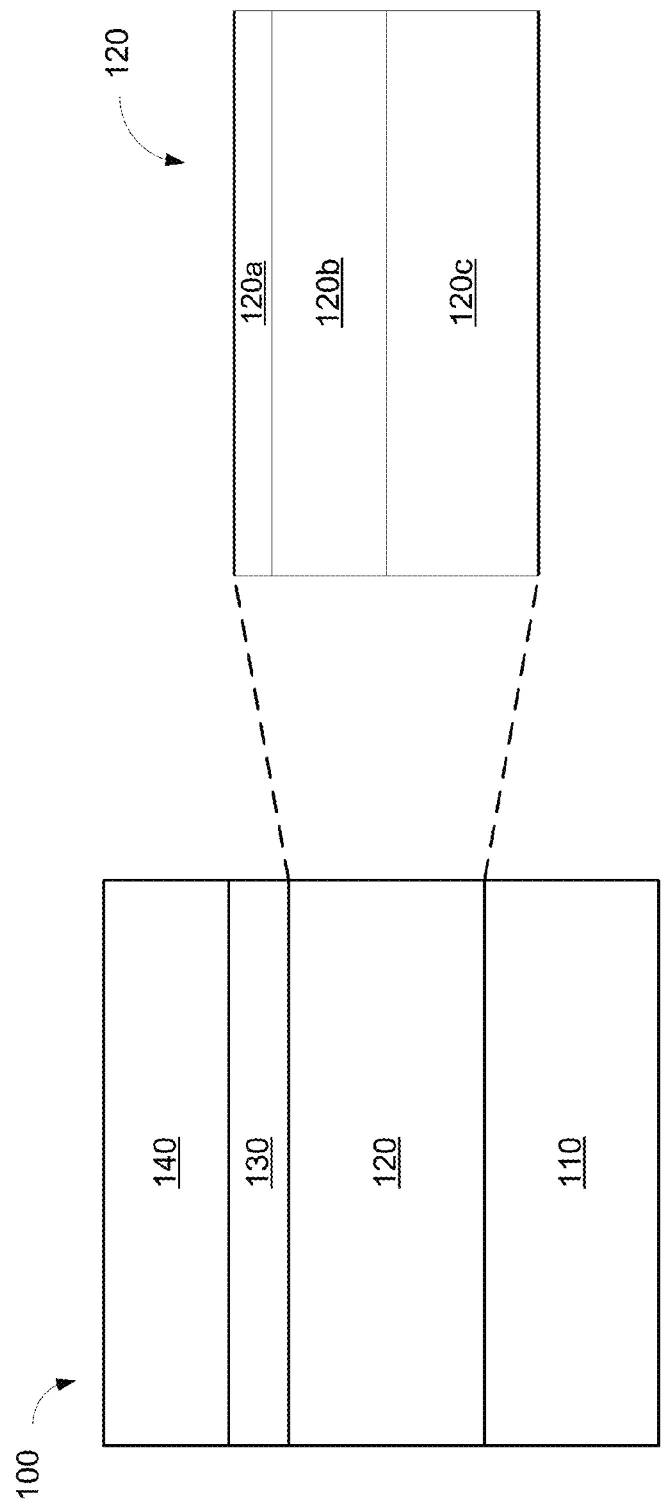
FIG. 1 is a schematic depiction of a multi-layer stack on a semiconductor substrate in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Patterning of thin films in semiconductor processing is often a critical step in the manufacture and fabrication of semiconductors. Conventional stacks for lithography often include a photoresist layer on top of an underlayer, which is typically deposited on a hardmask by spin-on methods. The hardmask is often made of one composition, and the hardmask itself is deposited on a target layer. Conventional patterning involves photolithography, such as 193 nm lithography. In photolithography, patterns are printed by emitting photons from a photon source onto a mask and printing the pattern onto a photosensitive photoresist, thereby causing a chemical reaction in the photoresist that removes certain portions of the photoresist to form the pattern. In conventional lithography, the number of photons that may hit the photoresist may vary. In many practices, a large number of photons hit the photoresist, with each photon carrying less energy. Since a large number of photons may be used, the error due to some stray photons does not substantially affect the resulting defined pattern.

As devices shrink, the need for printing smaller features increases. Although multiple patterning techniques have been developed for use with conventional photolithography, multiple patterning uses multiple layers of deposition and etching processes. Scaling of features on advanced semiconductor integrated circuits (ICs) and other devices has driven lithography to improve resolution by moving to ever smaller imaging source wavelengths.

Extreme ultraviolet (EUV) lithography has been developed to print smaller patterns on a photoresist using EUV light sources at approximately 13.5 nm wavelength in leading-edge lithography tools, which are also referred to as scanners. The EUV radiation is strongly absorbed in a wide range of materials, including quartz and water, and so operates in a vacuum.

In EUV lithography, fewer photons are emitted from the source and the photons hit the photoresist to form the pattern. Each of the photons carries higher energy than the photons used in conventional lithography. Moreover, in EUV lithography fewer higher energy photons hit the photoresist so a few stray photons that miss the photosensitive sites may cause a larger error in the defined pattern. Compared to conventional lithography where more lower-energy photons are used and a few stray photons may not affect the pattern substantially, the stochastic effect due to this photon and sensitizer shot noise in EUV lithography is of particular concern.

Provided herein is a multi-layer stack tailored to achieve optimum etch contrast to shrink features and smooth the edges of features while enabling use of the optical leveling sensor with little or reduced error. The multi-layer stack may be used to form lines or spaces or contacts and holes in integrated circuits and may form features for advanced technology nodes, as defined by the International Technology Roadmap for Semiconductors. Examples of these advanced technology nodes include 22 nm nodes, 16 nm nodes, and beyond. In the 16 nm node, the width of a typical via or line in a Damascene structure is no greater than about 30 nm.

FIG. 1 is a schematic illustration of an example of a multi-layer stack on a semiconductor substrate. The wafer 100 includes a target layer 110, a multi-layer stack 120, an optional underlayer 130, and a photoresist 140. The target layer 110 may be any target layer or substrate, such as a metal, an oxide, a dielectric material, or an ultra-low-k (ULK) substrate. In many embodiments, the target layer 110 is a silicon substrate.

The multi-layer stack 120 includes an atomically smooth layer 120*a*, and underlayers 120*b* and 120*c*. In many embodiments, the multi-layer stack 120 includes 2 underlayers (as shown in multi-layer stack 120), or more than 2 underlayers, or more than 3 underlayers, or more than 4 underlayers, or more than 5 underlayers. In some embodiments, underlayer 130 is included as part of the multi-layer stack 120. Optional underlayer 130 may be a spin-on layer or a layer deposited by plasma-enhanced chemical vapor deposition (PECVD). As an example, FIG. 1 depicts two underlayers 120*b* and 120*c*, as well as an atomically smooth layer 120*a*.

In various embodiments, the underlayer adjacent to target layer 110 is a robust hardmask layer, which may be measured by the modulus and stress. For example, robust hardmask layers may have a modulus of at least 100 MPa and a stress less than about 500 MPa. In many embodiments, underlayer 120*c*, or the underlayer adjacent to the target layer 110, is an amorphous carbon layer. In some embodiments, the modulus to stress ratio of an underlayer 120*c* of amorphous carbon is at least about 1:1. Examples of robust hardmask layers used for underlayer 110 may also include diamond-like carbon (DLC), doped amorphous carbon, and spin-on carbon (SoC).

In various embodiments, underlayers 120*b* and 120*c* may be removable after transferring a pattern to a subsequent layer. For example, underlayer 120*b* may be removed after a pattern is transferred to underlayer 120*c*. In some embodiments, underlayers 120*b* and 120*c* may reflect, or refract, or absorb a leveling beam emitted on the substrate to measure wafer levelness.

The composition of underlayers 120*b* and 120*c* may be selected from one of many classes of compositions, such as oxides, metals (e.g., hafnium, cobalt, tungsten, titanium) or conductive films (e.g., titanium nitride, titanium silicide, cobalt silicide), dielectric materials (e.g., silicon oxide, silicon nitride), hardmask materials (e.g., amorphous carbon, amorphous silicon), or others such as silicon oxynitride (SiON), nitrogen-free anti-reflective layer (NFARL), or silicon anti-reflective coating (SiARC). In one example, underlayer 120*b* is an amorphous silicon layer and underlayer 120*c* is an amorphous carbon layer. In most embodiments, underlayer 120*b* and underlayer 120*c* may each be between about 100 Å and about 900 Å thick.

Underlayers 120*b* and 120*c* are selected based on their etch contrast relative to adjacent layers. In many embodiments, underlayer 120*b* has a high etch contrast relative to underlayer 120*c* and also has a high etch contrast relative to 120*a*. In various embodiments, underlayer 120*c* has a high etch contrast relative to both underlayer 120*b* and target layer 110. For example, if underlayer 120*c* is an amorphous carbon layer, underlayer 120*b* may have high etch contrast to both the atomically smooth layer 120*a* and the amorphous carbon underlayer 120*c*.

Underlayers 120*b* and 120*c* may also be selected based on other optimizable properties, such as physical properties, chemical properties, and optical properties. Examples of such properties may include surface energy, bonding structure, hydrophobicity, refractive index, and extinction coefficient.

The atomically smooth layer 120*a* is a thin layer typically deposited in a layer near the top of the multi-layer stack, such as the first or second layer below the photoresist 140. The atomically smooth layer 120*a* is characterized by its very low roughness. "Atomically smooth" is defined as having a roughness of less than 1 monolayer, or about half a monolayer of deviation from the mean line. "Local" roughness is defined as the roughness in 1 square micron of surface area of a wafer. Roughness of a layer may be evaluated by observation and by atomic force microscopy (AFM). The roughness may be measured by the average of the vertical deviations of the roughness profile from the mean line. In one example, an "atomically smooth" layer 120*a* may have an average roughness of less than about 2 Å. Roughness may also be measured by the root mean square (RMS) of vertical deviations of the roughness profile from the mean line.

In many embodiments, the atomically smooth layer 120*a* is a thin layer. The thickness of the atomically smooth layer 120*a* may be between about 30 Å and about 60 Å. The atomically smooth layer 120*a* may have high etch contrast to adjacent layers and may also be removable after transferring the pattern to a subsequent layer. In various embodiments, the atomically smooth layer 120*a* is an oxide layer. In some examples, the atomically smooth layer 120*a* is a thin layer of silicon oxide.

The multi-layer stack may be used in EUV lithography by using a shrinking effect. A larger feature is printed on the photoresist using EUV lithography, and the feature is shrunk as each layer is etched down the multi-layer stack, thereby reducing roughness caused by photon and sensitizer shot noise described above. In many embodiments, the feature printed on the photoresist shrinks such that the patterned features in the target layer have a critical dimension less than or equal to about 70% of the size or width of the critical dimension of the pattern in the photoresist. The percentage of the shrinkage may be optimized by various etch processes. The percentage of shrinkage may also be limited by pitch.

Use of the multi-layer stack in EUV lithography may result in several optimized effects. For example, using a multi-layer stack may result in optimized low line edge roughness (LER). Line edge roughness may be defined as the deviation of a feature edge (as viewed top-down) from a smooth, ideal shape—that is, the edge deviations of a feature that occur on a dimensional scale smaller than the resolution limit of the imaging tool that was used to print the feature. The magnitude of LER may be affected by a multitude of factors, such as the photon shot noise in the exposing radiation, the stochastic nature of the dissolution of the photoresist in the developer, the metrology noise introduced by a scanning electron microscope, and chemical interactions between the photoresist and underlying film. Sidewall roughness on the patterned photoresist may be highly anisotropic and the roughness may propagate from the photoresist-substrate interface up the photoresist pattern sidewall. In ultrathin photoresist films, which may be about 100 nm in thickness or less, roughness may be correlated from the photoresist-substrate interface to the photoresist-air interface for a number of different photoresist material platforms. In EUV lithography, particularly for high volume manufacturing, photoresist LER is desired to be less than about 1 nm ($3\sigma$). As each layer is etched down in a multi-layer stack, the walls of the feature are smoothed and LER may be optimized to be closer to less than 1 nm.

Another optimized effect of using multi-layer stacks is improved throughput. Use of multi-layer stacks may enable or substantially enable high volume manufacturing by using EUV lithography. Thinner photoresist films may be used, thereby reducing the exposure dose used to pattern the photoresist. For example, reducing the photoresist thickness from approximately 1000 Å to approximately 300 Å may significantly reduce the dose needed to expose the photoresist, which thereby improves the scanner throughput. The photoresist may also serve as a mask during reactive ion etching (RIE) of the underlying films to transfer the mask pattern onto the target layer. Where the photoresist serves as a mask for this purpose, the lower limit on the photoresist thickness may be determined by the minimum thickness of the photoresist to enable use as a mask.

Another optimized effect of using multi-layer stacks may be obtaining low local critical dimension uniformity (LCDU). In various embodiments, low LCDU may be obtained by using EUV lithography to define a larger feature and narrowing or shrinking the feature each time the pattern is transferred down to each layer, such as an atomically smooth layer, then one or more underlayers, and finally to the target layer.

Another optimized effect of using multi-layer stacks in EUV lithography is the effective use of an optical leveling sensor to determine levelness of the wafer. To accurately print a pattern in conventional lithography, leveling methods are used to ensure that the photons hit a level photoresist and accurately print the pattern onto the photoresist. Formation of suitable images in the photoresist often involves precise alignment of the focal plane of the exposure radiation projected onto the photoresist film. This is important because the defined pattern of the photoresist is used as a starting point to etch the semiconductor substrate and to define subsequent layers of the semiconductor stack.

Figure 2:
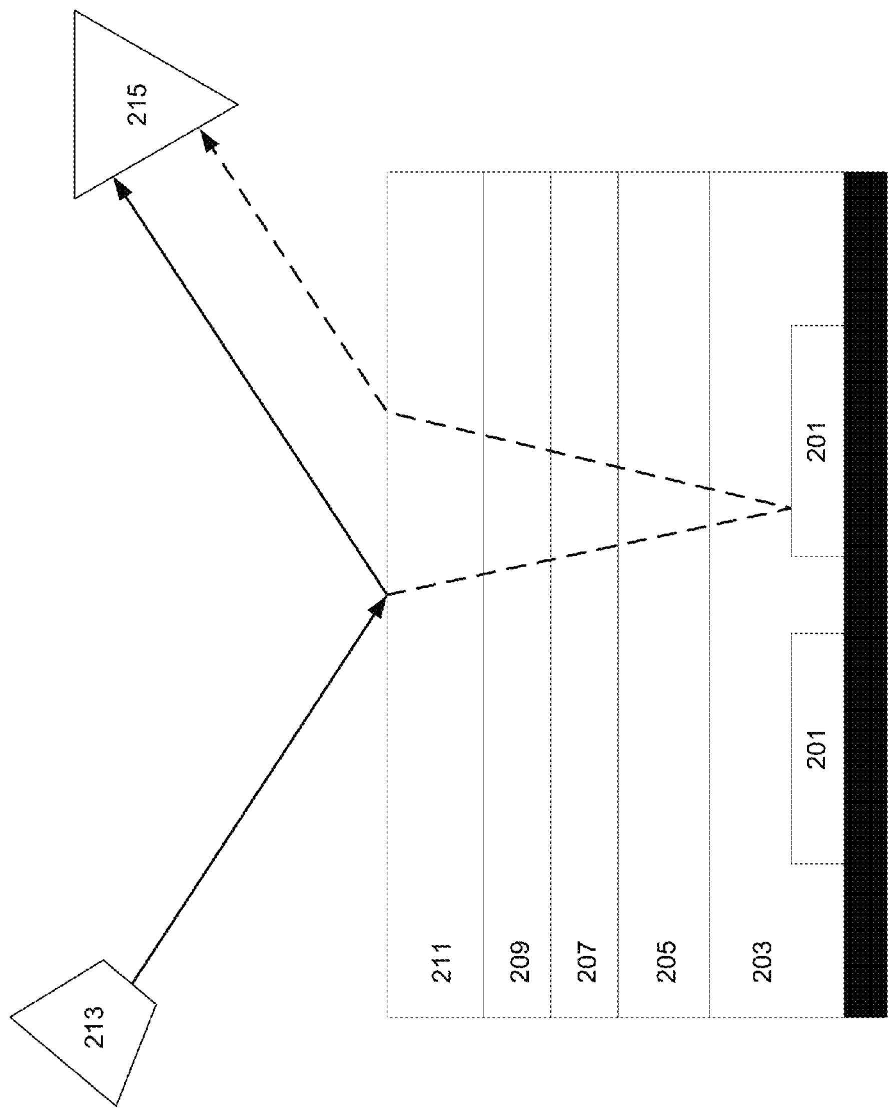
FIG. 2 is a schematic depiction of an optical leveling sensor for use in accordance with disclosed embodiments.

The levelness of a substrate may be measured by an optical leveling sensor. FIG. 2 provides an example of a schematic illustration of an optical leveling sensor detecting the levelness of the wafer. The substrate or wafer includes a metal 201, which may be patterned; an oxide layer 203; a hardmask layer 205 which may be an amorphous carbon ($\alpha$-C) or amorphous silicon ($\alpha$-Si) layer; a cap layer 207, which may be a silicon oxynitride (SiON) layer; an underlayer 209; and a photoresist 211. Optical leveling sensors often involve a leveling beam 213, which may emit a beam onto the photoresist 211. Optical sensors may operate in approximately the 500 nm to 1800 nm wavelength range, which is also called the broadband leveling beam. The photoresist 211 reflects the beam, and the reflected beam is detected by a sensor 215. Depending on the properties of the wafer or the photoresist, the sensor will be able to accurately detect whether the substrate is level. Because many different types of wafers may be processed in a tool or apparatus, the optical leveling sensor should be able to determine the levelness of various types of wafers. However, since the photoresist 211 may refract the beam to underlayers which may have other reflective or refractive properties, such as the metal 201 as shown in FIG. 2, a subsequent layer may reflect and/or refract the leveling beam, which is also then detected by the sensor 215. As depicted, the beam reflected off of the metal layer 201 and was also detected by the sensor 215. Thus, a source of errors in detection of the surface of the photoresist is the reflection of the incident broadband beams from existing wafer topography. As a result, the sensor may not be able to determine the levelness of the wafer accurately. Although the optical leveling sensor may be able to determine levelness quickly, the optical leveling sensor has a higher level of error due to the various types of wafers used in conventional lithography.

Alternatively, an air gauge may be used to evaluate levelness of wafers in lithography. The air gauge measures the back pressure under the wafer and can detect whether a wafer is imbalanced. However, although the measurement is more accurate, a measurement for whether the wafer is level takes longer, thereby reducing wafer throughput.

In contrast to conventional lithography, EUV lithography is most typically performed in a vacuum. The air gauge may not be used to detect whether the wafer is level for lithography because the air gauge measures pressure. Thus, an optical leveling sensor used to measure the levelness of the wafer and standard wafers used in EUV lithography may cause reflection or refraction that reflects or refracts the beam, and the sensor may detect the wrong reflected or refracted beam in error.

The multi-layer stack described herein is useful because one or more underlayer may have absorbing properties that prevent or block the leveling beam from reflecting and refracting subsequent layers, thereby decreasing the error of the measurements detected by the sensor. Thus, multi-layer stacks enable accurate optical focusing and leveling systems in EUV lithography tools by replacing the currently used films with optimized multi-layer stacks as described herein.

One example of a multi-layer stack that may exhibit these optimized properties is provided. Each layer may be deposited using PECVD. The target layer may be a silicon oxide-based layer, such as a TEOS layer about 1500 Å thick. On top of the target layer may be a first underlayer of amorphous carbon, which may be an ashable hardmask. The amorphous carbon layer may be robust and have a high modulus, particularly to maintain the fine pattern when it is patterned in subsequent steps. Example thicknesses of the amorphous carbon layer may be about 400 Å or about 900 Å. On top of the amorphous layer may be a second underlayer of amorphous silicon, which has high etch contrast with amorphous carbon. In some embodiments the amorphous silicon is doped. In some embodiments, the amorphous silicon is undoped. This layer may be about 100 Å thick. On top of the amorphous silicon layer may be an atomically smooth layer. The amorphous silicon layer may have high etch contrast with the atomically smooth layer. The atomically smooth layer may be a silicon oxide layer about 30 Å to about 60 Å thick, and may be deposited such that the roughness of the film is less than a monolayer. For example, the average roughness of the atomically smooth layer may be about 2 Å. On top of the atomically smooth layer may be a photoresist layer. This example of a multi-layer stack may be used in EUV lithography by patterning larger features than desired in the photoresist layer, then patterning and etching the pattern down and removing each layer such that as the pattern is etched down each layer, the feature shrinks by size.

Method

Figure 3:
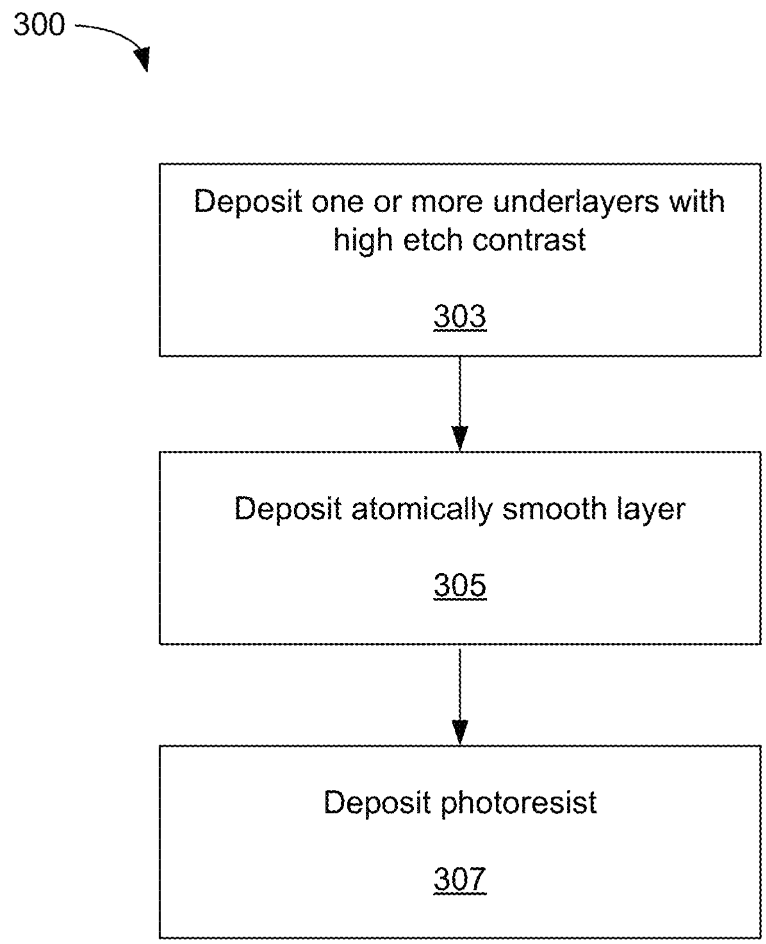
FIG. 3 is a process flow diagram of a method in accordance with disclosed embodiments.

Provided herein are methods of depositing multi-layer stacks in accordance with disclosed embodiments. FIG. 3 is a process flow diagram depicting a method 300 of depositing a multi-layer stack. Prior to operation 303, a target layer may be deposited on a substrate, or a substrate including a target layer may be provided. In many embodiments, the target layer is deposited on a substrate or wafer, such as a silicon wafer. In some embodiments, the target layer is a metal layer, oxide layer, dielectric layer, or an ultra-low-k layer. In a specific embodiment, the target layer is tetraethyl orthosilicate (TEOS). The thickness of the target layer may vary from about 200 Å to about 2000 Å, or about 1500 Å.

In operation 303, one or more underlayers are deposited on the substrate. In many embodiments, the underlayers are deposited directly on top of the target layer. In some embodiments, one underlayer is deposited. In various embodiments, two underlayers are deposited. The number of underlayers that may be deposited may range from 1 to at least 4 or at least 5 or more.

Each underlayer may have a composition different than or the same as an adjacent layer and is removable after transferring a pattern to a subsequent layer. In various embodiments, at least one of the underlayers is a hardmask layer. Underlayers may be oxides, metals, conductive films, dielectric material, or other material. Example metals include hafnium, cobalt, tungsten, and titanium and example conductive films include titanium nitride, titanium silicide, and cobalt silicide. Example dielectric materials include silicon oxide and silicon nitride. Other example underlayer compositions include amorphous carbon, amorphous silicon, silicon oxynitride (SiON), nitrogen-free anti-reflective layer (NFARL), and silicon anti-reflective coating (SiARC). In some embodiments, the underlayer deposited directly on top of the target layer has a high modulus or is highly robust, which may be measured by modulus or stress. Examples of robust underlayers include amorphous carbon, or diamond-like carbon. In some embodiments, an amorphous carbon layer may be deposited as at least one of the one or more underlayers by exposing the substrate to a hydrocarbon precursor.

In various embodiments, the underlayer deposited directly on top of the target layer has high etch contrast to the target layer. Each underlayer has high etch contrast to the adjacent underlayer. For example, a target layer of TEOS has high etch contrast to a layer of amorphous carbon. Thus, in some embodiments, an underlayer of amorphous carbon may deposited on top of a target layer of TEOS.

The thickness of each underlayer may range from about 100 Å to about 900 Å or from about 400 Å to about 900 Å. In some embodiments, the thickness of each underlayer is the same. In some embodiments, the thickness of each underlayer is different. In various embodiments, the thickness of an underlayer on top of the target layer is thicker than other underlayers. In a specific example, a 400 Å underlayer of amorphous carbon is deposited on the target layer, and a 100 Å layer of amorphous silicon with low hydrogen content is deposited on top of the amorphous carbon layer. The hydrogen content in a low-hydrogen amorphous silicon layer may be less than about 5%, or less than about 10%, or less than about 20%. The low-hydrogen content may depend on the adhesion of a layer on top of the amorphous silicon layer. In many embodiments, an amorphous carbon layer may also have low hydrogen content, or less than about 10% hydrogen, or less than about 20% hydrogen.

Returning to FIG. 3, in operation 305, an atomically smooth layer is deposited on the substrate. "Atomically smooth" may be defined as having a local roughness less than 1 monolayer, or about half a monolayer. "Local" roughness may be defined as the roughness measured in 1 square micron of wafer surface area. Roughness of the layer may be evaluated by observation or atomic force spectroscopy and may be measured by evaluating the average of vertical deviations of the roughness profile from the mean line, or the root mean square (RMS) of vertical deviations of the roughness profile from the mean line. In some embodiments, the average local roughness of the atomically smooth layer is less than about 2 Å.

In many embodiments, the atomically smooth layer is deposited on the one or more underlayers. In a specific embodiment, the atomically smooth layer is deposited on top of a low-hydrogen amorphous silicon layer. In various embodiments, the atomically smooth layer is removable after transferring a pattern to a subsequent layer. The atomically smooth layer may be a thin layer and have a thickness between about 30 Å and about 60 Å. Compared to the underlayer below the atomically smooth layer and to any layer deposited on top of the atomically smooth layer, the atomically smooth layer may have a high etch contrast. In a specific example, the atomically smooth layer is a thin layer of silicon oxide ($SiO_2$). In many embodiments, the atomically smooth layer is an oxide layer.

In operation 307, a photoresist may be deposited on the atomically smooth layer. In various embodiments, the photoresist may be directly adjacent to the atomically smooth layer such that the photoresist is deposited directly on top of the atomically smooth layer. In many embodiments, the atomically smooth layer and one or more underlayers are deposited such that the layers are between the photoresist and the target layer. In some embodiments, before the photoresist is deposited, one or more underlayer is deposited on top of the atomically smooth layer. In many embodiments, the photoresist may be poly(methyl methacrylate) poly(methyl glutarimide) (PMGI) or phenol formaldehyde resin. The thickness of the photoresist may be between about 100 Å and about 600 Å, for example about 300 Å. In some embodiments, the thickness of the deposited photoresist is 600 Å.

In some embodiments, the photoresist may be patterned using extreme ultraviolet (EUV) lithography. In many embodiments, EUV lithography involves depositing photosensitive sites of a defined pattern onto the photoresist and printing the pattern onto the photoresist. In many embodiments, after the pattern is defined on the photoresist, the pattern is transferred to subsequent layers by a shrinking method such that the size of the features defined shrinks as each layer is patterned and removed.

Each layer described in method 300 may be deposited by various methods. Examples of deposition processes include atomic layer deposition (ALD), plasma-enhanced ALD (PEALD), conformal film deposition (CFD), chemical vapor deposition (CVD), plasma-enhanced CVD (PECVD), physical vapor deposition (PVD), and spin-on methods. In some embodiments, an underlayer in operation 303 may be deposited by a deposition technique, such as plasma-enhanced chemical vapor deposition (PECVD), and may involve generating a plasma in the deposition chamber from deposition gases including a hydrocarbon precursor. The hydrocarbon precursor may be defined by the formula $C_xH_y$, where x is an integer between 2 and 10, and y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used.

Apparatus

Deposition and use of multi-layer stacks described herein may be performed on any apparatus suitable for semiconductor processing. In some embodiments, the apparatus may be integrated and may have one or more chambers or stations for processing semiconductor substrates. An apparatus suitable for practicing methods described herein may also include lithography tools, deposition tools, etching tools, and others.

As an example, deposition techniques provided herein may be implemented in a plasma-enhanced chemical vapor deposition (PECVD) reactor or a conformal film deposition (CFD) reactor. Such a reactor may take many forms and may be part of an apparatus that includes one or more chambers or reactors—sometimes including multiple stations—that may each house one or more wafers and may be configured to perform various wafer operations. The one or more chambers may maintain the wafer in a defined position or positions (with or without motion within that position, e.g., rotation, vibration, or other agitation). In one implementation, prior to operations performed in disclosed embodiments, a wafer undergoing film deposition may be transferred from one station to another within a reactor or chamber during the process. In other implementations, the wafer may be transferred from chamber to chamber within the apparatus to perform different operations. Full deposition or any fraction of the total film thickness for any deposition step may occur entirely at a single station. While in process, each wafer may be held in place by a pedestal, wafer chuck, and/or other wafer-holding apparatus. For certain operations in which the wafer is to be heated, the apparatus may include a heater, such as a heating plate. A Vector™ (e.g., C3 Vector) or Sequel™ (e.g., C2 Sequel) reactor, produced by Lam Research Corp. of Fremont, Calif., are both examples of suitable reactors that may be used to implement the techniques described herein.

Figure 4:
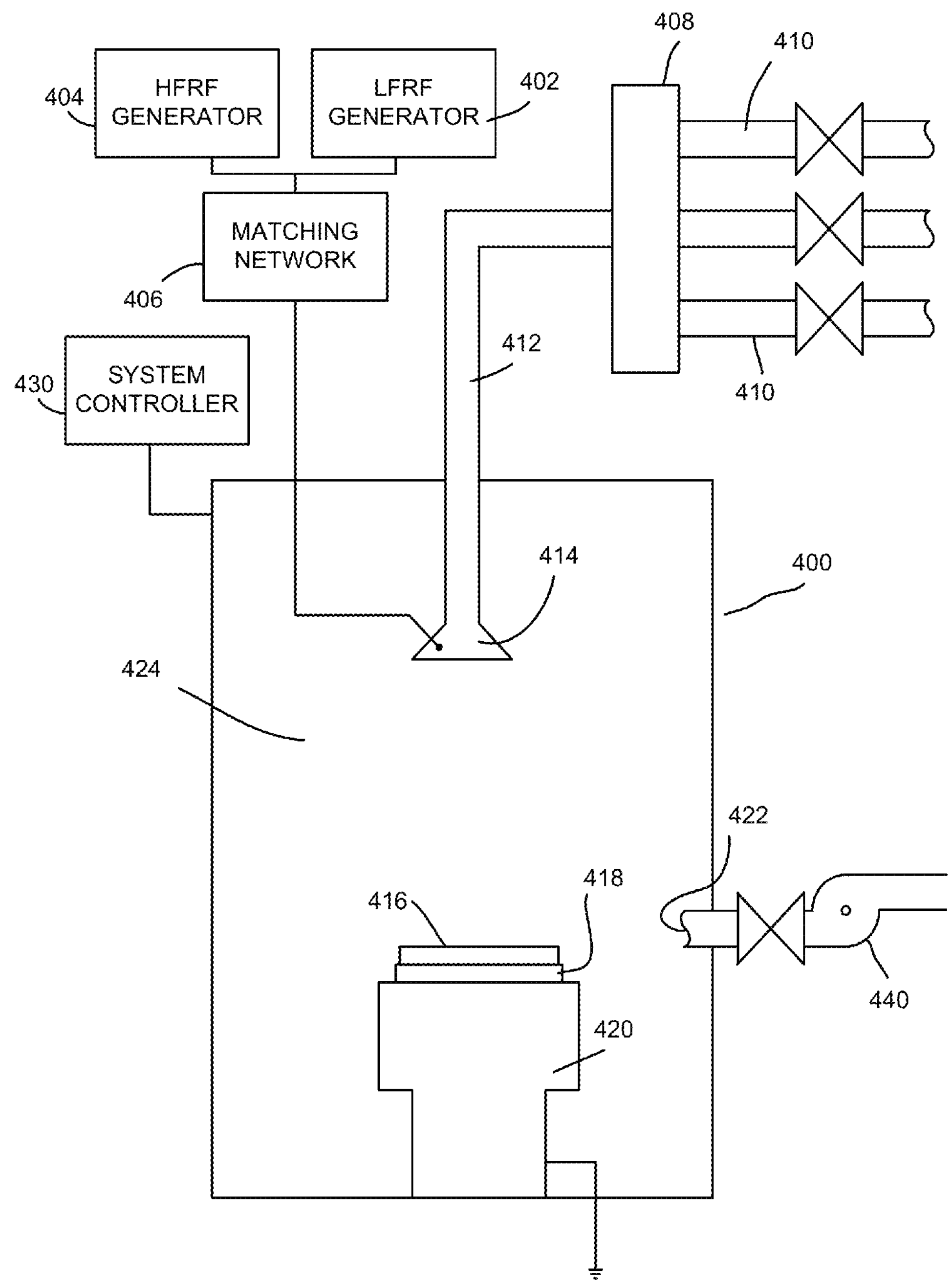
FIG. 4 is a schematic illustration of a deposition chamber for use in accordance with disclosed embodiments.

FIG. 4 provides a simple block diagram depicting various reactor components arranged for implementing methods described herein. As shown, a reactor 400 includes a process chamber 424 that encloses other components of the reactor 400 and serves to contain plasma generated by a capacitive-discharge type system including a showerhead 414 working in conjunction with a grounded heater block 420. A high frequency (HF) radio frequency (RF) generator 404 and a low frequency (LF) RF generator 402 may be connected to a matching network 406 and to the showerhead 414. The power and frequency supplied by matching network 406 may be sufficient to generate a plasma from process gases supplied to the process chamber 424. In a typical process, the HFRF component may generally be between 5 MHz to 60 MHz, e.g., 13.56 MHz. In operations where there is an LF component, the LF component may be from about 100 kHz to 2 MHz, e.g., 430 kHz.

Within the reactor, a wafer pedestal 418 may support a substrate 416. The wafer pedestal 418 may include a chuck, a fork, or lift pins (not shown) to hold and transfer the substrate into and out of the chamber 424 between operations. The chuck may be an electrostatic chuck, a mechanical chuck, or various other types of chuck as are available for use in the industry and/or for research.

Various process gases may be introduced via inlet 412. Multiple source gas lines 410 are connected to manifold 408. The gases may be premixed or not. Appropriate valving and mass flow control mechanisms may be employed to ensure that the correct process gases are delivered during the deposition and plasma treatment phases of each operation in the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber 424.

Process gases may exit chamber 424 via an outlet 422. A vacuum pump, e.g., a one or two stage mechanical dry pump and/or turbomolecular pump 440, may be used to draw process gases out of the process chamber 424 and to maintain a suitably low pressure within the process chamber 424 by using a closed-loop-controlled flow restriction device, such as a throttle valve or a pendulum valve.

As discussed above, the techniques for deposition discussed herein may be implemented on a multi-station or single station tool. In specific implementations, a 300 mm Lam Vector™ tool having a 4-station deposition scheme or a 200 mm Sequel™ tool having a 6-station deposition scheme may be used. In some implementations, tools for processing 450 mm wafers may be used. In various implementations, the wafers may be indexed after every deposition process, or may be indexed after etching steps if the etching chambers or stations are also part of the same tool, or multiple depositions and treatments may be conducted at a single station before indexing the wafer. In some implementations, the wafers may be indexed after each layer is deposited, such as after an underlayer is deposited, or after an atomically smooth layer is deposited.

In some embodiments, an apparatus may be provided that is configured to perform the techniques described herein. A suitable apparatus may include hardware for performing various process operations as well as a system controller 430 having instructions for controlling process operations in accordance with the disclosed embodiments. The system controller 430 will typically include one or more memory devices and one or more processors communicatively connected with various process control equipment, e.g., valves, RF generators, wafer handling systems, etc., and configured to execute the instructions so that the apparatus will perform a technique in accordance with the disclosed embodiments, e.g., a technique such as that provided in the operations of FIG. 3. Machine-readable media containing instructions for controlling process operations in accordance with the present disclosure may be coupled to the system controller 430. The controller 430 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 430 may control all of the activities of the reactor 400. The system controller 430 may execute system control software stored in a mass storage device, loaded into a memory device, and executed on a processor. Alternatively, the control logic may be hard coded in the controller 430. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. The system control software may include instructions for controlling the timing of gas flows, wafer movement, RF generator activation, etc., as well as instructions for controlling the mixture of gases, the chamber and/or station pressure, the chamber and/or station temperature, the wafer temperature, the target power levels, the RF power levels, the substrate pedestal, chuck, and/or susceptor position, and other parameters of a particular process performed by the reactor apparatus 400. The system control software may be configured in any suitable way. For example, various process tool component subroutines or control objects may be written to control operation of the process tool components necessary to carry out various process tool processes. The system control software may be coded in any suitable computer readable programming language.

The system controller 430 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 430.

The method and apparatus described herein may be used in conjunction with lithographic patterning tools or processes such as those described below for fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step performed with a number of possible tools: (1) application of photoresist on a workpiece, i.e., substrate or multi-layer stack as provided in disclosed embodiments, using a spin-on or spray-on tool; (2) curing a photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferred the resist pattern into an underlying film or workpiece, such as an amorphous carbon underlayer, by using a dry or plasma-assisted etching tool; and (6) removing the resist using a tool such as an RF or microwave plasma resist stripper.

Figure 5:
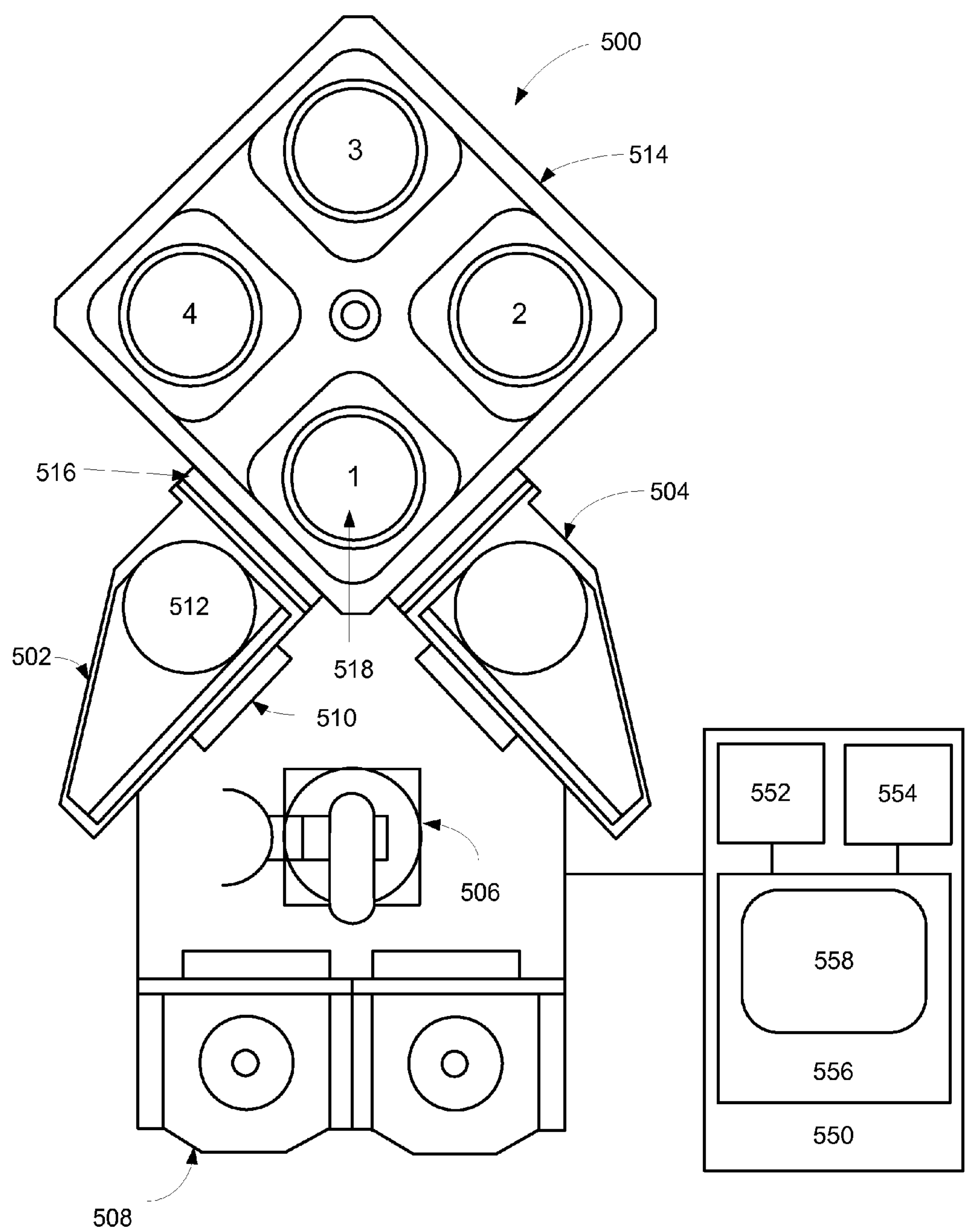
FIG. 5 is a schematic illustration of a deposition tool for use in accordance with disclosed embodiments.

One or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506, at atmospheric pressure, is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 includes a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between a CFD and PECVD process mode. Additionally or alternatively, in some embodiments, processing chamber 514 may include one or more matched pairs of CFD and PECVD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 also depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by process tool 500. System control software 558 may be configured in any suitable way. For example, various process tool component subroutines or control objects may be written to control operation of the process tool components necessary to carry out various process tool processes. System control software 558 may be coded in any suitable computer readable programming language.

In some embodiments, system control software 558 may include input/output control (IOC) sequencing instructions for controlling the various parameters described above. For example, each operation of a deposition process may include one or more instructions for execution by system controller 550. The instructions for setting process conditions for a PECVD process operation may be included in a corresponding PECVD recipe process operation. In some embodiments, the PECVD process operations may be sequentially arranged, so that all instructions for a PECVD process are executed concurrently with that process phase.

Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition and flow rates and optionally for flowing gas into one or more process stations prior to deposition of a multi-layer stack in order to stabilize the pressure in the process station. In some embodiments, the controller 550 includes instructions for depositing one or more underlayers, then depositing an atomically smooth layer.

A pressure control program may include code for controlling the pressure in the process station by regulating, for example, a throttle valve in the exhaust system of the process station, a gas flow into the process station, etc. In some embodiments, the controller 550 includes instructions for depositing one or more underlayers and depositing an atomically smooth layer.

A heater control program may include code for controlling the current to a heating unit that is used to heat the substrate. Alternatively, the heater control program may control delivery of a heat transfer gas (such as helium) to the substrate. In certain implementations, the controller 550 includes instructions for depositing one or more underlayers, and depositing an atomically smooth layer.

A plasma control program may include code for setting RF power levels and exposure times in one or more process stations in accordance with the embodiments herein. In some embodiments, the controller 550 includes instructions for depositing one or more underlayers, and depositing an atomically smooth layer.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of multi-layer film stacks according to various embodiments described herein.

The system controller 550 will typically include one or more memory devices and one or more processors configured to execute the instructions so that the apparatus will perform a method in accordance with the disclosed embodiments. Machine-readable, non-transitory media containing instructions for controlling process operations in accordance with the disclosed embodiments may be coupled to the system controller 550.

Experimental

Experiments were conducted to evaluate the effect of using a multi-layer stack in extreme ultraviolet (EUV) lithography. Two types of multi-layer stacks were used to pattern generic via holes.

Figure 6A:
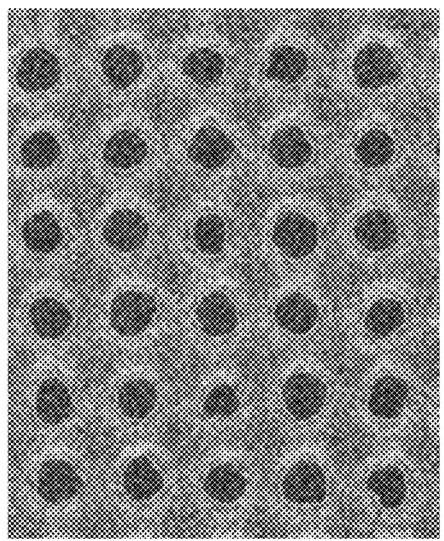
FIGS. 6A-6D and 7A-7D are images of patterns formed in experimental results using disclosed embodiments.

In the first experiment, a 1500 Å layer of tetraethyl orthosilicate (TEOS) was deposited on a silicon substrate as the target layer. A 900 Å underlayer of amorphous carbon was deposited on the target layer, followed by a 200 Å layer of amorphous silicon with low hydrogen content. A 60 Å atomically smooth layer was deposited on the amorphous silicon layer. A 100 Å underlayer was deposited on the atomically smooth layer, followed by deposition of a standard 600 Å photoresist. The wafer with the multi-layer stack was patterned using EUV lithography to pattern larger holes in the photoresist. The improvement in local critical dimension uniformity (LCDU) for 30 nm vias in 52 nm pitch was evaluated. The goal LCDU was 2.5 nm ($3\sigma$). The average critical dimension (CD) of the photoresist after EUV lithography was 28.9 nm and the LCDU was 4.92 nm ($3\sigma$). A top-down image of the patterned photoresist on the multi-layer stack is shown in FIG. 6A.

Figure 6B:
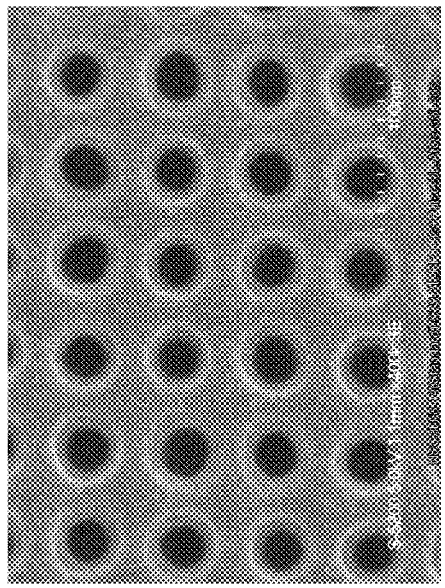
Figure 6C:
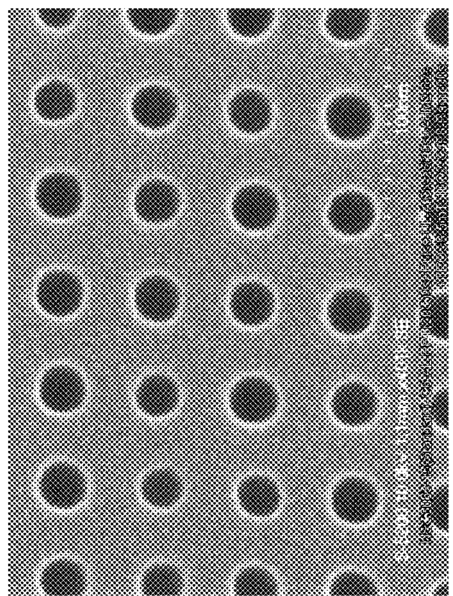
Figure 6D:
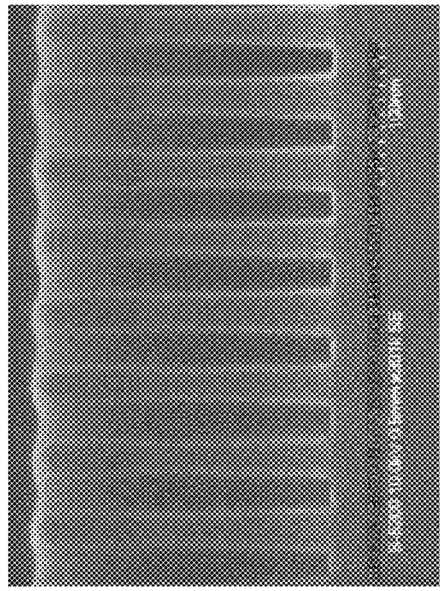

The subsequent layers were patterned and etched while shrinking the feature to a target size. After the photoresist was pretreated and the pattern was transferred to the amorphous carbon in a hardmask open etch (hereinafter "HMO"), the average CD was 27.9 nm and the LCDU was 2.56 ($3\sigma$). A top-down image of the patterned substrate after HMO is provided in FIG. 6B. Lastly, the target layer was patterned and the local CD average was 23.1 nm with an LCDU of 2.38 ($3\sigma$). A top-down image of the patterned target layer is provided in FIG. 6C and a side profile view of the patterned target layer is provided in FIG. 6D. The resulting CD shrank such that the target layer CD was approximately 70% of the size of the CD in the photoresist. The target layer etch was close to the goal LCDU of 2.5. As shown in FIGS. 6C and 6D, the patterned target layer has smooth edges and low line edge roughness.

Figure 7A:
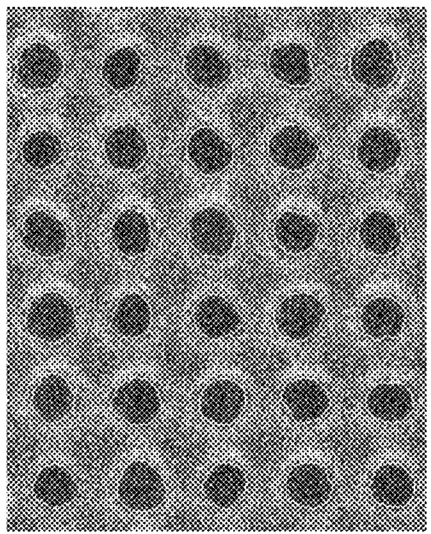

In the second experiment, a 1000 Å layer of tetraethyl orthosilicate (TEOS) was deposited on a silicon substrate as the target layer. A 400 Å underlayer of amorphous carbon was deposited on the target layer, followed by a 100 Å layer of amorphous silicon with low hydrogen content. A 30 Å atomically smooth layer was deposited on the amorphous silicon layer. A 100 Å underlayer was deposited on the atomically smooth layer, followed by deposition of a 300 Å standard photoresist. The wafer with the multi-layer stack was patterned using EUV lithography to pattern larger holes in the photoresist. The improvement in local critical dimension uniformity (LCDU) for 30 nm vias in 52 nm pitch was evaluated. The goal LCDU was 2.5 nm (3σ). The average CD of the photoresist after EUV lithography was 28.6 nm and the LCDU was 4.29 nm (3σ). A top-down image of the patterned photoresist is provided in FIG. 7A.

Figure 7B:
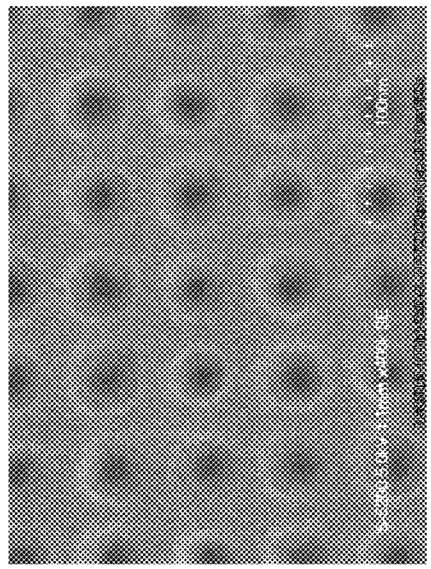
Figure 7C:
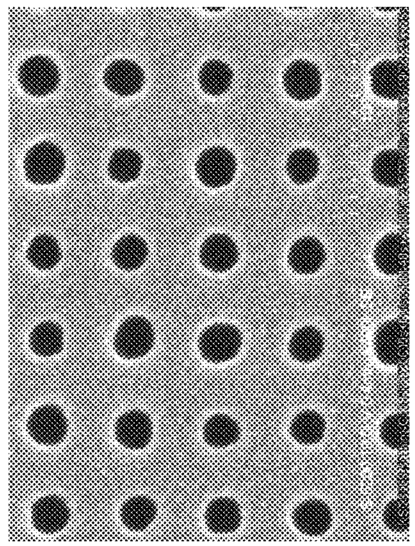
Figure 7D:
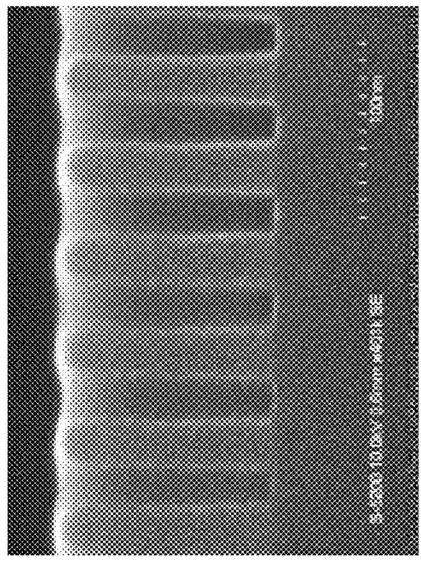

The subsequent layers were patterned and etched while shrinking the feature to a target size. After HMO, the average CD was 20.9 nm and the LCDU was 3.39 (3σ). A top-down image of the substrate after HMO is provided in FIG. 7B. Lastly, the target layer was patterned and the local CD average was 22.8 nm with an LCDU of 2.77 (3σ). A top-down image of the patterned target layer is provided in FIG. 7C and a side profile view of the patterned target layer is provided in FIG. 7D. The resulting critical dimension (CD) shrank such that the target layer CD was approximately 70% of the size of the CD in the photoresist. The target layer etch was close to the goal LCDU of 2.5. The quality of the patterned target layer in FIGS. 7C and 7D is comparable to that of the target layer in FIGS. 6C and 6D. This suggests that thinner films, such as thinner underlayers or thinner photoresists, may be used in EUV lithography. This may thereby increase throughput of wafers in semiconductor processing.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A method of processing a semiconductor substrate for extreme ultraviolet lithography, the method comprising:

depositing one or more underlayers on a target layer;

depositing an atomically smooth layer having a roughness of less than a monolayer; and depositing a photoresist layer on top of the atomically smooth layer, wherein the atomically smooth layer is deposited by plasma-enhanced chemical vapor deposition.

2. The method of claim 1, wherein each layer is deposited by plasma-enhanced chemical vapor deposition.

3. The method of claim 1, wherein depositing the one or more underlayers further comprises depositing an amorphous carbon layer on the target layer by exposing the substrate to a hydrocarbon precursor.

4. The method of claim 1, wherein the atomically smooth layer is deposited to a thickness between about 30 Å and about 60 Å.

5. The method of claim 1, further comprising patterning the photoresist layer using extreme ultraviolet lithography.

6. An apparatus for processing semiconductor substrates, the apparatus comprising:

one or more process chambers;

one or more gas inlets into the one or more process chambers and associated flow-control hardware;

a low frequency radio frequency (LFRF) generator;

a high frequency radio frequency (HFRF) generator; and a controller having at least one processor and a memory, wherein the at least one processor and the memory are communicatively connected with one another, the at least one processor is at least operatively connected with the flow-control hardware, the LFRF generator, and the HFRF generator, and the memory stores computer-executable instructions for:

depositing one or more underlayers on a substrate;

depositing an atomically smooth layer having a roughness of less than a monolayer; and depositing a photoresist layer on top of the atomically smooth layer, wherein the atomically smooth layer is deposited by plasma-enhanced chemical vapor deposition.

7. The apparatus of claim 6, wherein the atomically smooth underlayer is deposited to a thickness between about 30 Å and about 60 Å.

8. The apparatus of claim 6, wherein at least one of the one or more underlayers deposited on the substrate comprises amorphous carbon.

9. The method of claim 1, wherein the atomically smooth layer comprises an oxide.

10. The method of claim 1, wherein the average local roughness of the deposited atomically smooth layer is less than about 2 Å.

11. The method of claim 3, wherein the amorphous carbon layer has a hydrogen content less than about 20%.

12. The method of claim 3, wherein the amorphous carbon layer is deposited to a thickness between about 400 Å and about 900 Å.

13. The method of claim 3, wherein the amorphous carbon layer has a modulus to stress ratio of about 1:1.

14. The method of claim 1, wherein one of the one or more underlayers comprises amorphous silicon having a hydrogen content less than about 5%.

* * * * *